United States Patent
Shen

(10) Patent No.: US 8,939,613 B2
(45) Date of Patent: Jan. 27, 2015

(54) LIGHT-EMITTING DIODE DIE PACKAGES AND METHODS FOR PRODUCING

(71) Applicant: Yu-Nung Shen, Taipei (TW)

(72) Inventor: Yu-Nung Shen, Taipei (TW)

(73) Assignee: Yu-Nung Shen, Taipei (TW)

( * ) Notice: Subject to any disclaimer, the term of this patent is extended or adjusted under 35 U.S.C. 154(b) by 226 days.

(21) Appl. No.: 13/677,513

(22) Filed: Nov. 15, 2012

(65) Prior Publication Data

US 2013/0170186 A1   Jul. 4, 2013

(30) Foreign Application Priority Data

Dec. 31, 2011  (TW) .............................. 100150080 A

(51) Int. Cl.
| | | |
|---|---|---|
| *H01L 33/50* | (2010.01) | |
| *H01L 33/00* | (2010.01) | |
| *G09F 13/04* | (2006.01) | |
| *H01L 33/56* | (2010.01) | |
| *H01L 33/58* | (2010.01) | |

(52) U.S. Cl.
CPC .............. *H01L 33/50* (2013.01); *H01L 33/005* (2013.01); *G09F 13/04* (2013.01); *H01L 33/0095* (2013.01); *H01L 33/505* (2013.01); *H01L 33/56* (2013.01); *H01L 33/58* (2013.01); *H01L 2933/0033* (2013.01); *H01L 2933/0041* (2013.01)

USPC ................................ 362/311.02; 362/249.02

(58) Field of Classification Search
USPC ....................... 362/249.02, 311.02
See application file for complete search history.

(56) References Cited

U.S. PATENT DOCUMENTS

| | | | |
|---|---|---|---|
| 2011/0096545 A1* | 4/2011 | Chang ...................... | 362/249.02 |
| 2011/0188248 A1* | 8/2011 | Chang ...................... | 362/249.02 |
| 2012/0099028 A1* | 4/2012 | Yokota ......................... | 348/798 |

\* cited by examiner

*Primary Examiner* — Laura Tso
(74) *Attorney, Agent, or Firm* — Jackson IPG PLLC

(57) ABSTRACT

A LED die package includes an LED chip having a p-type electrode and an n-type electrode; an accommodating housing, for accommodating the LED chip, being made of transparent material and defining an accommodating space, an open end through which the accommodating space is accessible, a closed end opposite to the open end, and two through holes formed on a surface of the closed end, wherein the LED chip is mounted within the accommodating space, so that the p-type electrode and the n-type electrode of the LED chip are exposed via the trough holes; and a carrier having a conductor mounting surface and predetermined conductors formed on the conductor mounting surface, wherein the LED chip is mounted on the conductor mounting surface of the carrier, so that the respective electrodes thereof are electrically connected to predetermined conductors formed on the conductor mounting surface of the carrier via wires.

21 Claims, 15 Drawing Sheets

LIGHT-EMITTING DIODE DIE PACKAGES AND METHODS FOR PRODUCING

PRIORITY CLAIM

This application claims priority to R.O.C. Patent Application No. 100150080 filed Dec. 31, 2011, the entirety of which is incorporated herein by reference.

BACKGROUND OF THE INVENTION

1. Field of the Invention

The present invention relates to light-emitting diode (LED) die packages and methods for producing the same, and more particularly, to LED die packages and methods for producing the same with a reduced bin number.

2. Description of the Prior Art

FIG. 31 is a schematic side view of a conventional LED package. FIG. 32 is a schematic diagram showing a bin distribution of LED chips after packaging, in which the light emitted from the LED chips have the same wavelength and the same brightness.

Referring to FIG. 31, the conventional LED package includes an LED chip 91 disposed on a lead frame 90, and a lens 92 formed on the lead frame 90 in a manner covering the LED chip 91.

The electrodes (not shown) of the LED chip 91 are connected electrically to the corresponding legs 900 of the lead frame 90 via wires 93.

It should be noted that a phosphor layer 94 is formed on an electrode-side surface of the LED chip 91. The formation of the layer 94 is achieved by the following steps: coating the electrode-side surface of the LED chip 91 with liquid phosphor layer material and curing the liquid phosphor layer material by a baking process so as to form the phosphor layer 94. However, the convention process for formation of the phosphor layer 94 has the following drawbacks:

1. Uneven thickness—flowing of the liquid phosphor layer material in all directions may occur before performing the baking process and, therefore, the respective phosphor layers 94 formed on the respective LED chips 91 will differ in thickness.

2. Different area—due to the same reason as mentioned in point 1 above, the areas of the respective phosphor layers 94 formed on the respective LED chips 91 will be different.

3. Different shape—due to the same reason as mentioned in point 1 above, the respective phosphor layers 94 formed on the respective LED chips 91 will differ in shape.

4. Relative position offset—due to the same reason as mentioned in point 1 above, the positions of the respective phosphor layers 94 formed on the respective LED chips 91 relative to the corresponding LED chips 91 will be different.

Due to the aforesaid drawbacks, the LED chips which originally emit light with the same wavelength and the same brightness would be unfavorably fabricated into LED chip packages that show a broad variety in terms of color temperature, brightness and wavelength, resulting in the so-called side bins. Referring to FIG. 9 that shows a bin distribution resulted from the drawbacks described above, it should be noted that the LED chips sorted into the same bin will be divided into 128 bins after the packaging process. Normally, only the central 60% of the packages in the distribution are adapted for subsequent use, and the rest 40% are considered as side bins. As a result, the manufacture cost is increased.

Moreover, since the cross-sectional area of the wire 93 is so small that the heat generated by the LED chip 91 can hardly dissipate to the surroundings through the legs 900 of the lead frame 90, the heat would consequently reduce the efficiency of the LED chip package.

In view of the above, R.O.C. Patent Application No. 097118327, entitled "Light-Emitting Diode Die Package and Method for Producing Same" and assigned to the present applicant, was filed previously to serve as a solution to the conventional drawbacks. In order to fulfill the need in this respect, the inventor has further devised a new LED die package and a method for producing the same, as disclosed herein.

SUMMARY OF THE INVENTION

Accordingly, an object of the invention is to provide LED die packages and methods for producing the same.

In order to achieve this object, a light-emitting diode die package according to a technical feature of the invention is provided, which comprises an LED chip having a p-type electrode and an n-type electrode; an accommodating housing for accommodating the LED chip, the accommodating housing being made of transparent material and defining an accommodating space, an open end through which the accommodating space is accessible, a closed end opposite to the open end, and two through holes formed on a surface of the closed end, wherein the LED chip is mounted within the accommodating space of the accommodating housing, so that the p-type electrode and the n-type electrode of the LED chip are exposed via the trough holes defined by the accommodating housing; and a carrier having a conductor mounting surface and predetermined conductors formed on the conductor mounting surface, wherein the LED chip disposed within the accommodating space of the accommodating housing is mounted on the conductor mounting surface of the carrier, so that the respective electrodes thereof are electrically connected to predetermined conductors formed on the conductor mounting surface of the carrier via wires.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
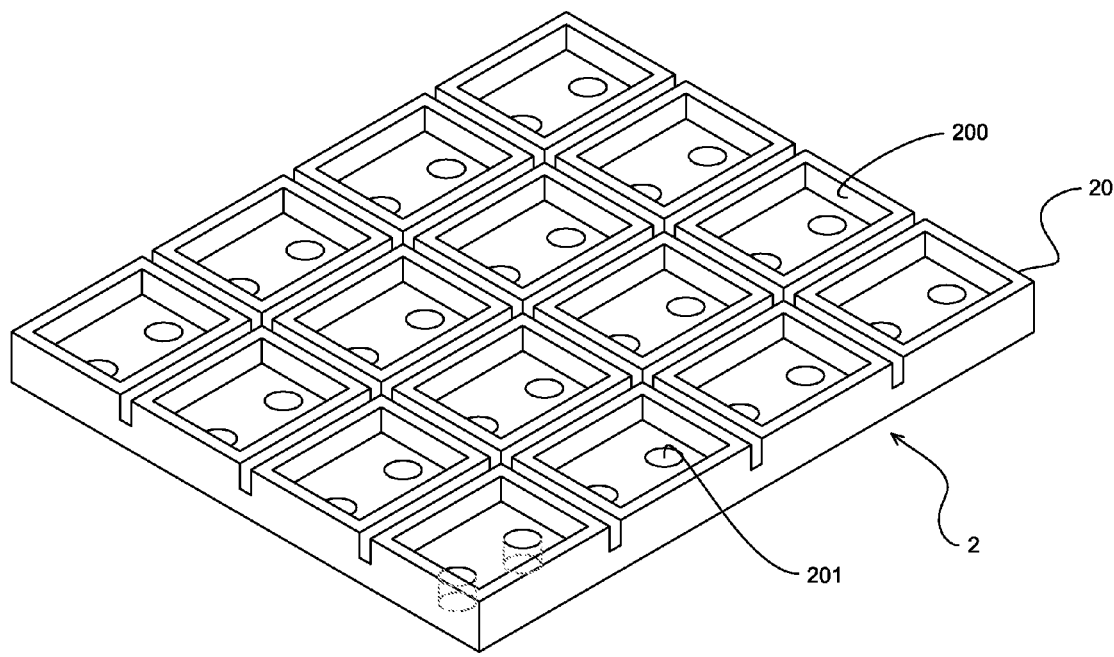
FIGS. 1-5 are schematic diagrams illustrating a method for producing an LED die package according to the first preferred embodiment of the invention.
Figure 2:
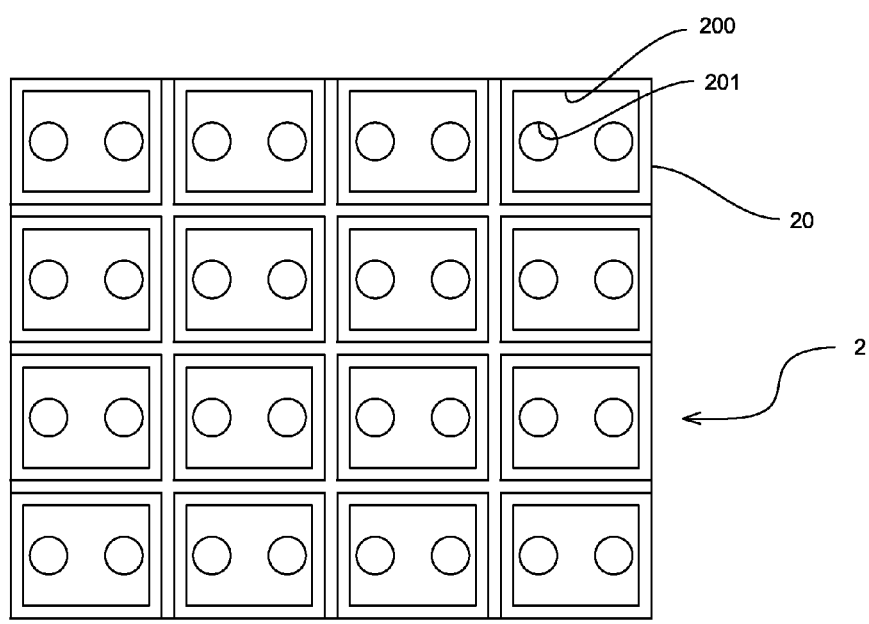

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

FIGS. 1-5 are schematic diagrams illustrating a method for producing an LED die package according to a preferred embodiment of the invention.

Referring to FIGS. 1-5, a frame 2 is fabricated to have an array of generally basin-shaped rectangular accommodating housings 20 arranged in the form of a matrix. The frame 2 is made of transparent material, optionally doped with phosphor powder, using any suitable process, such as a molding process. Each of the accommodating housings 20 includes an open end through which an accommodating space 200 is accessible, and a closed end oppositely arranged to the open end and having a surface formed with two through holes 201.

Figure 3:
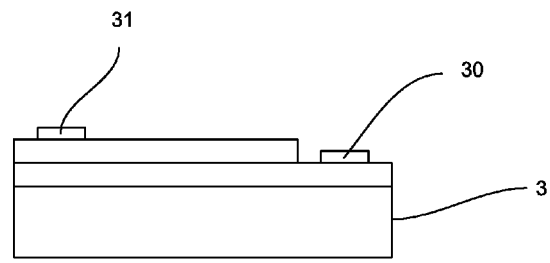

Next, a number of LED chips 3 shown in FIG. 3 are mounted, each having a first electrode 30 and a second electrode 31. The first electrode 30 has an opposite polarity with respect to the second electrode 31. That is, one of the first electrode 30 and the second electrode 31 being an n-type electrode and the other being a p-type electrode.

Figure 4:
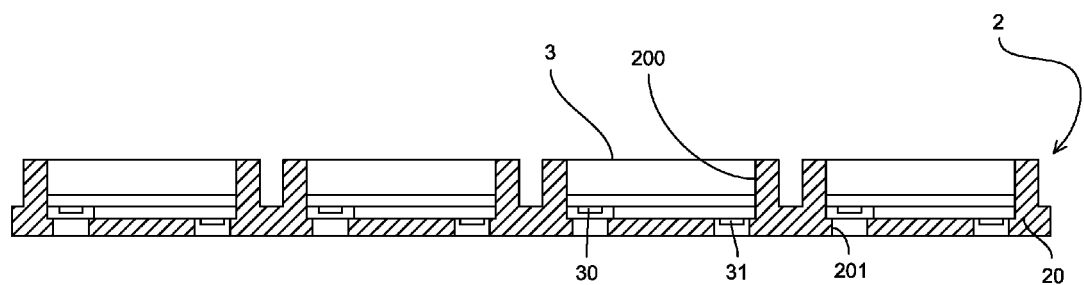

Each LED chip 3 is mounted within a corresponding one of the accommodating spaces 200 of the accommodating housings 20 of the frame 2, so that the electrodes 30, 31 of the LED chip 3 are registered with the corresponding through holes 201 formed on the accommodating housing 20, as shown in FIG. 4.

It should be noted that while not being illustrated in the appended drawings, the LED chips 3 can be secured within the accommodating housings 20 corresponding thereto by using any transparent adhesive material suitable for this purpose (namely, a die attach adhesive).

Figure 5:
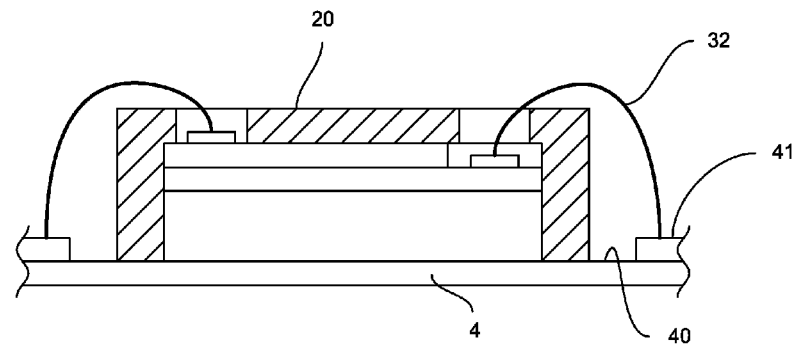
Figure 6:
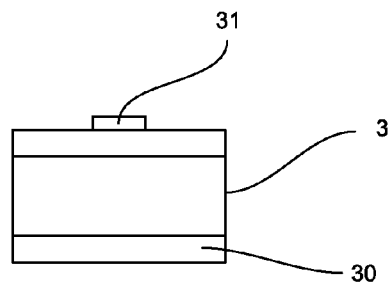
FIGS. 6-10 are schematic diagrams illustrating a method for producing an LED die package according to the second preferred embodiment of the invention.

Afterwards, the frame 2 is subjected to a dicing process, so that the accommodating housings 20 of the frame 2 are separated from one another, as shown in FIG. 5. Each LED chip 3 disposed within the accommodating space 200 of the accommodating housing 20 is then mounted onto a conductor mounting surface 40 of a carrier 4, with the respective electrodes 30, 31 thereof being wire-bonded and electrically connected to predetermined conductors 41 formed on the conductor mounting surface 40 of the carrier 4 via wires 32, so as to obtain an LED die package.

FIGS. 6-10 are schematic diagrams illustrating a method for producing an LED die package according to the second preferred embodiment of the invention.

As shown in FIGS. 6-10, the second preferred embodiment differs from the first embodiment above in that the LED chips 3 are vertical type LED chips, meaning that each of the LED chips 3 includes a first electrode 30 at its bottom side and a second electrode at its top side. In addition, according to this embodiment, each accommodating housing 20 of the frame 2 is formed with a single through hole 201 on the surface facing the open end.

Figure 7:
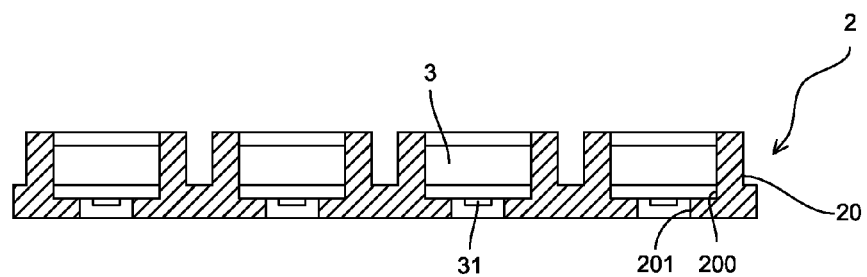

Each LED chip 3 is mounted within an accommodating space 200 defined by the corresponding accommodating housing 20 of the frame 2, so that the second electrode 31 of the LED chip 3 is registered with the through hole 201 formed on the corresponding accommodating housing 20, as shown in FIG. 7.

Figure 8:
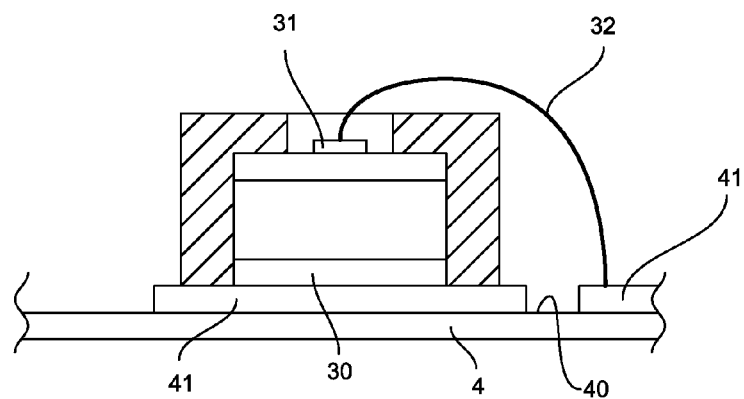
Figure 9:
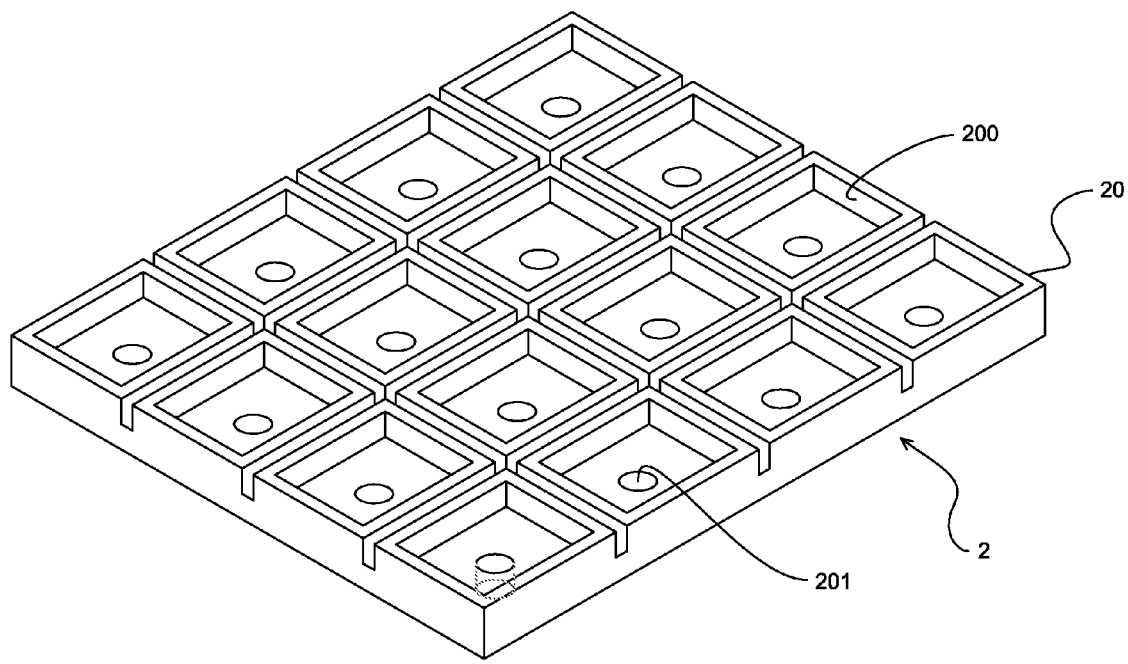
Figure 10:
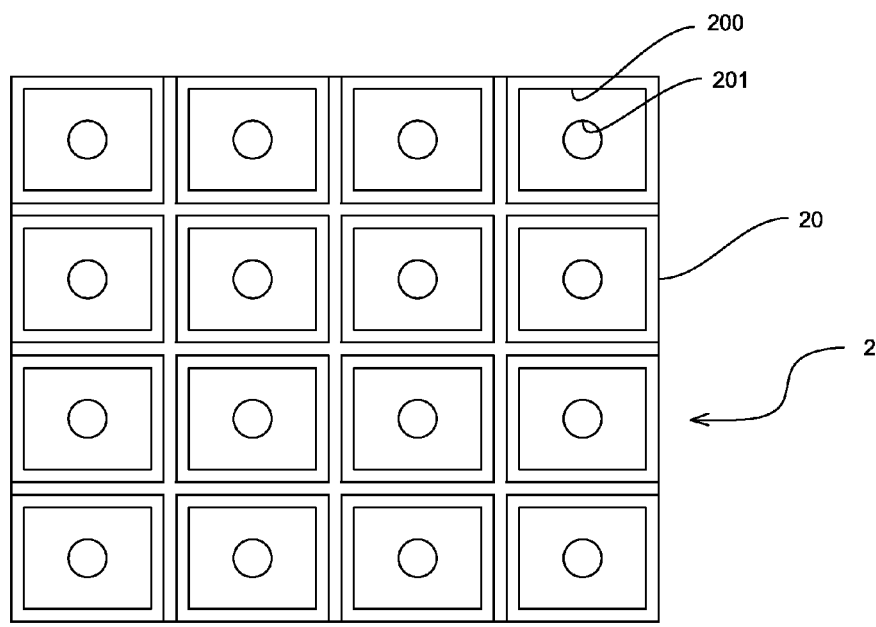
Figure 11:
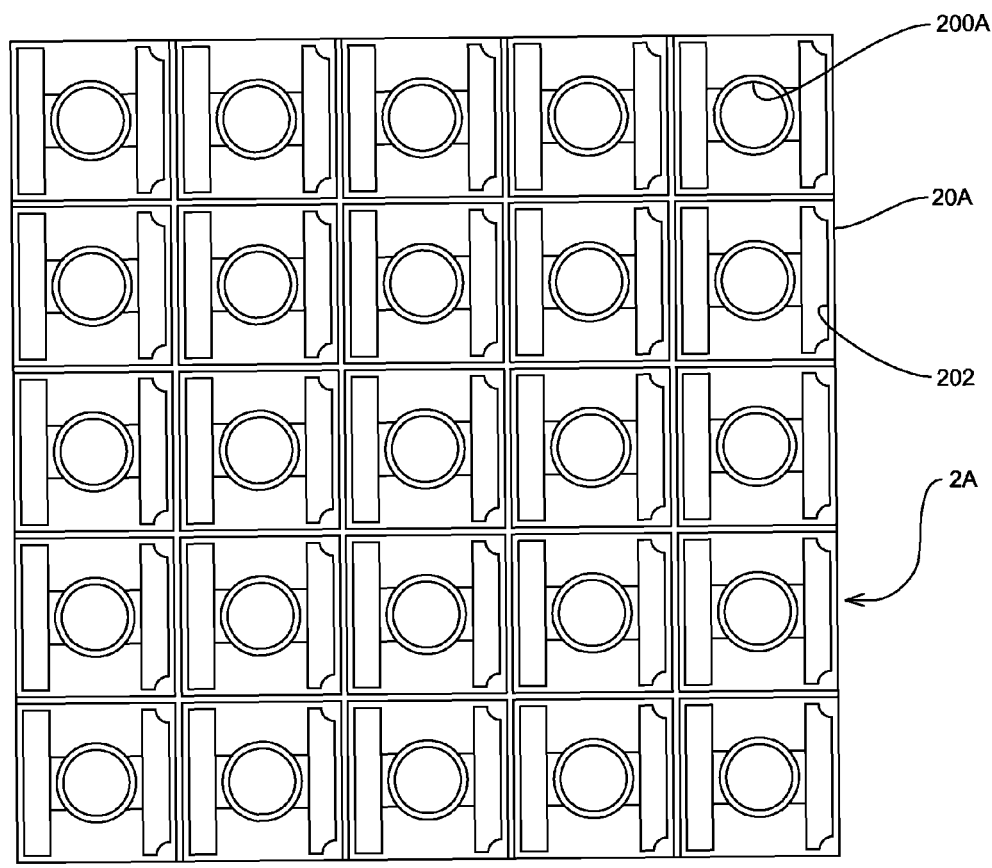
FIGS. 11-14 are schematic diagrams illustrating a method for producing an LED die package according to the third preferred embodiment of the invention.
Figure 12:
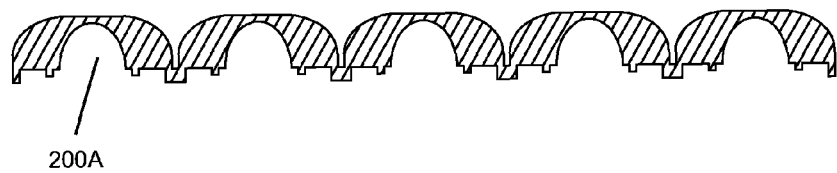

Afterwards, the frame 2 is subjected to a dicing process, so that the accommodating housings 20 of the frame 2 are separated from one another, as shown in FIG. 8. Each LED chip 3 disposed within the accommodating space 200 of the accommodating housing 20 is then mounted onto a predetermined conductor 41 formed on a conductor mounting surface 40 of a carrier 4, with the electrode 30 thereof being electrically connected to the conductor 41 and the electrode 31 thereof being wire-bonded and electrically connected to another predetermined conductor 41 formed on the conductor mounting surface 40 of the carrier 4 via a wire 32, so as to obtain an LED die package.

It should be noted that according to the first and second preferred embodiments described above, the LED chips 3 may each comprise two or more LEDs connected in series or the frame 2 may be diced during the dicing process in such manner that a single LED die package contains a plurality of housings 20.

Since the respective accommodating housings 20 of the LED die packages are of the same shape and thickness, in the case where the accommodating housings 20 are made of transparent material doped with phosphor powder, the phosphor powder will generate light with the same color temperature and brightness by being excited by the blue light emitted from the LED chips. Therefore, the conventional problem of producing 40% side bins caused by application of phosphor powder during the LED packaging process is overcome. Moreover, the position of the LED chip 3 relative to the accommodating housing 20 will not offset. The invention effectively overcomes the drawbacks present in the conventional LED packages accordingly.

FIGS. 11-14 are schematic diagrams illustrating a method for producing an LED die package according to the third preferred embodiment of the invention.

Referring to FIGS. 11-14, a frame 2A is fabricated to have an array of accommodating housings 20A arranged in the form of a matrix. The frame 2A is made of transparent material, optionally doped with phosphor powder, using any suitable process, such as a molding process. Each of the accommodating housings 20A includes an open end through which an accommodating space 200A is accessible, and two conductor forming grooves 202 formed on a surface that defines the open end. Each accommodating space 200A is filled with transparent material to constitute a transparent material layer 5. Optionally, the transparent material layer 5 is made of transparent material doped with phosphor powder (see FIG. 12).

In this embodiment, each accommodating space 200A is fabricated to generally have a bullet-head configuration.

An LED chips 3 described herein is then fixed onto the transparent material layer 5 in the accommodating space 200A, with the electrodes 30, 31 facing away from the transparent material layer 5, using a suitable transparent adhesive material, such as a die attach adhesive. After the fixation of the LED chip 3 onto the transparent material layer 5, additional transparent material 5 is added along the periphery of the LED chip 3, thereby preventing the LED chip 3 from offsetting in lateral directions. Then, within the respective conductor forming grooves of the accommodating housing 20A, respective conductors 6 are formed in a manner extending to a corresponding one of the electrodes 30, 31 of the LED chip 3 disposed in the accommodating housing 20A, as shown in FIG. 13.

It should be understood that the transparent adhesive material used to secure the LED chip 3 is not limited to die attach adhesives and any material suitable for this purposed can be used under the spirit of the invention.

Figure 13:
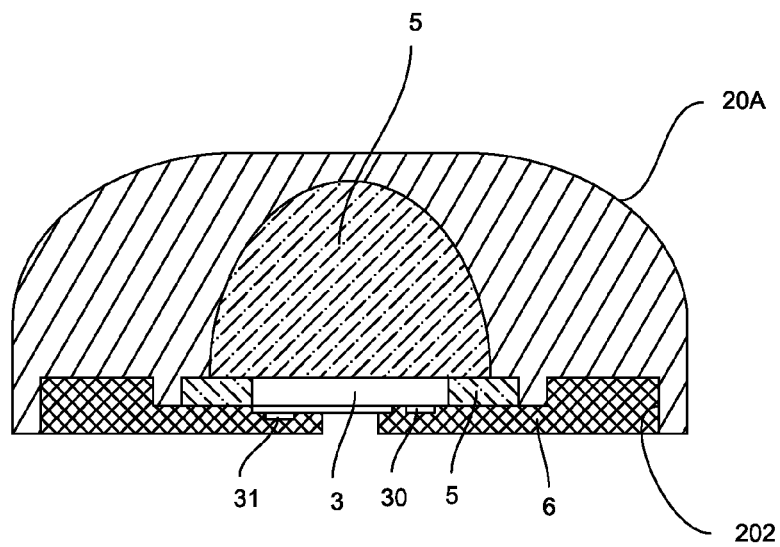
Figure 14:
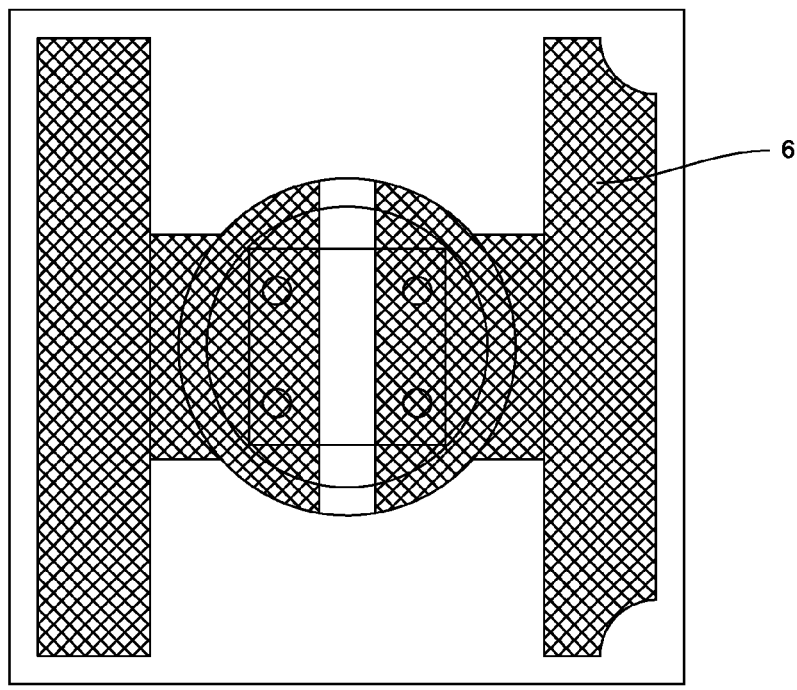
Figure 15:
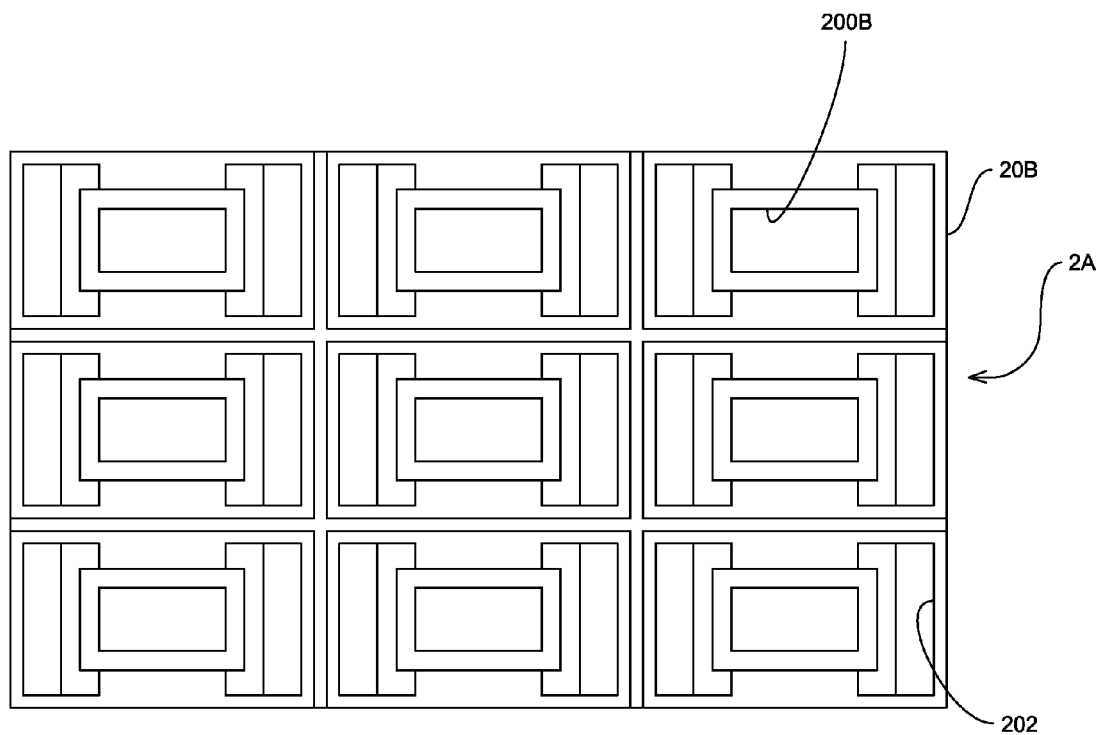
FIGS. 15-18 are schematic diagrams illustrating a method for producing an LED die package according to the fourth preferred embodiment of the invention.
Figure 16:
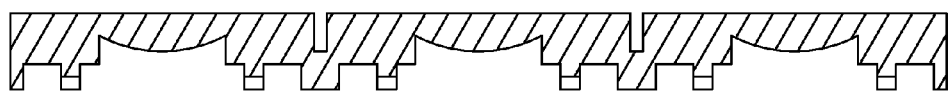

Referring to FIGS. 13 and 14, the frame 2A is then subjected to a dicing process, so that the accommodating housings 20A of the frame 2A are separated from one another, so as to obtain individual LED die packages.

FIGS. 15-18 are schematic diagrams illustrating a method for producing an LED die package according to the fourth preferred embodiment of the invention.

The fourth preferred embodiment differs from the third preferred embodiment in that each accommodating space 200B defined by an accommodating housing 20B of the frame 2B is fabricated in a generally rectangular configuration with a bottom surface facing the open end being convex towards the open end.

Except for the structural features described above, the fourth preferred embodiment is generally identical to the third preferred embodiment and, thus, is not described in detail herein.

FIGS. 19-22 are schematic diagrams illustrating a method for producing an LED die package according to the fifth preferred embodiment of the invention.

The fifth preferred embodiment differs from the third preferred embodiment in that each accommodating space 200C defined by an accommodating housing 20C of the frame 2C is fabricated in a generally rectangular configuration.

Except for the structural features described above, the fifth preferred embodiment is generally identical to the third preferred embodiment and, thus, is not described in detail herein.

Figure 23:
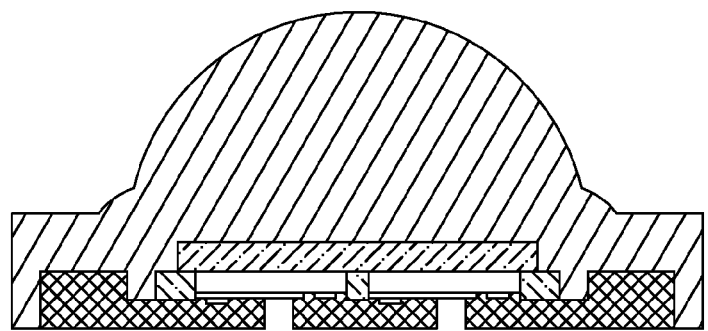
FIGS. 23-24 are schematic diagrams illustrating an LED die package according to the sixth preferred embodiment of the invention.
Figure 24:
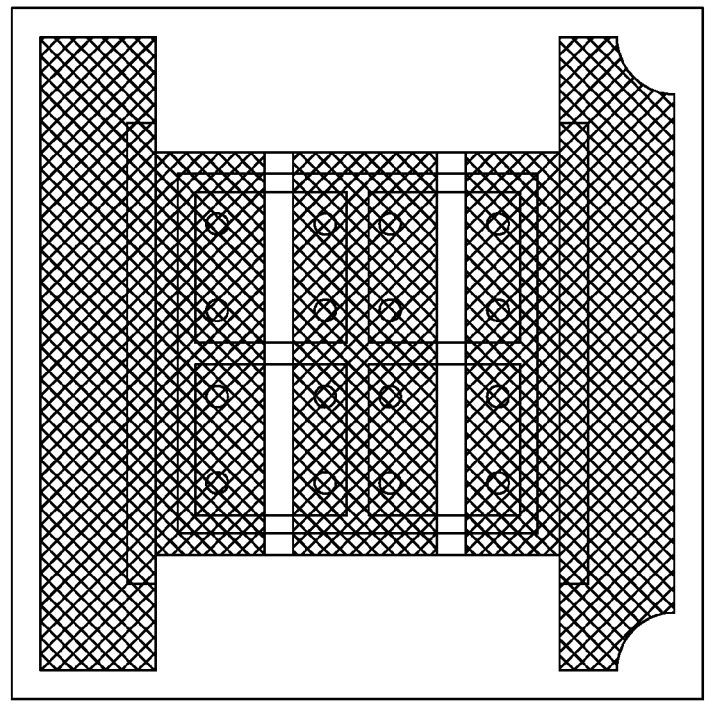

FIGS. 23-24 are schematic diagrams illustrating an LED die package according to the sixth preferred embodiment of the invention.

The sixth preferred embodiment differs from the fifth preferred embodiment in that each LED die package comprises four LED chips 3 connected in series.

Except for the structural arrangement described above, the sixth preferred embodiment is generally identical to the fifth preferred embodiment and, thus, is not described in detail herein.

Figure 25:
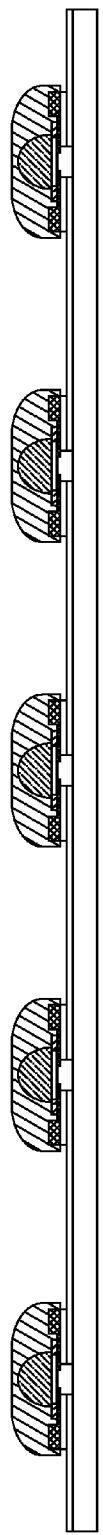
FIGS. 25 and 26 are exemplary schematic diagrams illustrating a backlight bar provided with the LED die packages according to the third preferred embodiment of the invention
Figure 26:
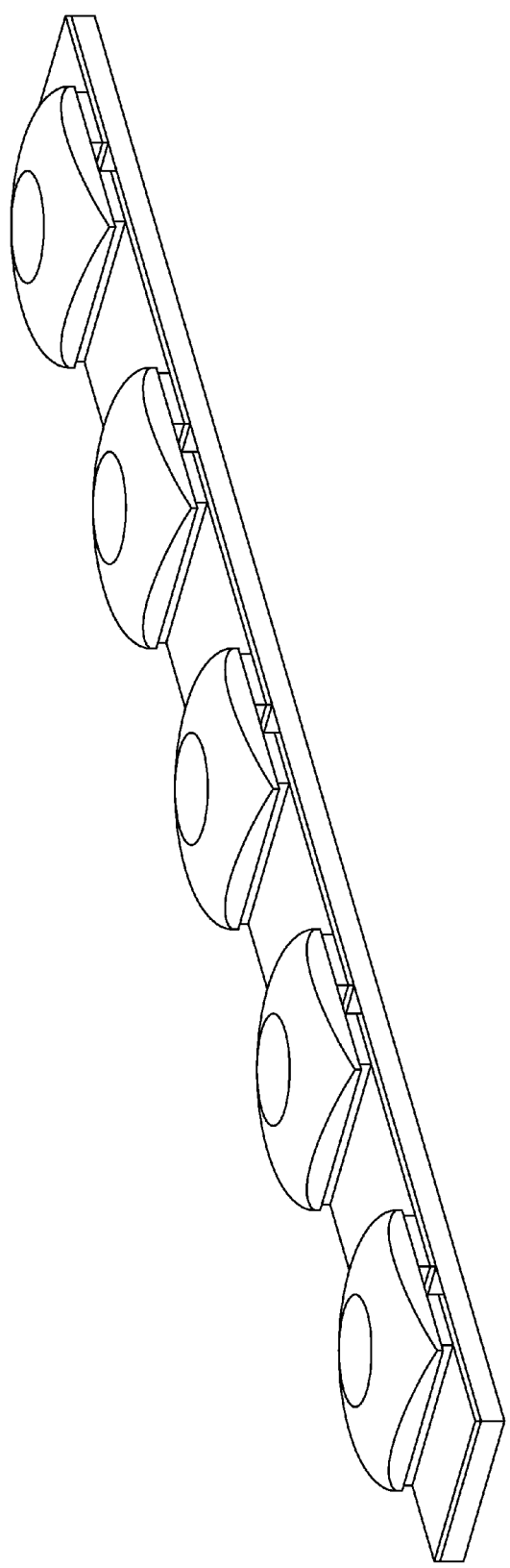

FIGS. 25-26 are exemplary schematic diagrams illustrating a backlight bar provided with the LED die packages according to the third preferred embodiment of the invention.

As illustrated, a number of the LED die packages shown in FIG. 13 are operatively mounted on the backlight bar by installing the LED die packages onto predetermined circuit traces (not shown) formed on a circuit mounting surface of a substrate.

Figure 27:
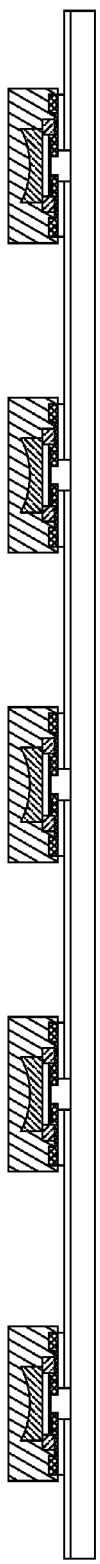
FIGS. 27 and 28 are exemplary schematic diagrams illustrating a backlight bar provided with the LED die packages according to the fourth preferred embodiment of the invention.
Figure 28:
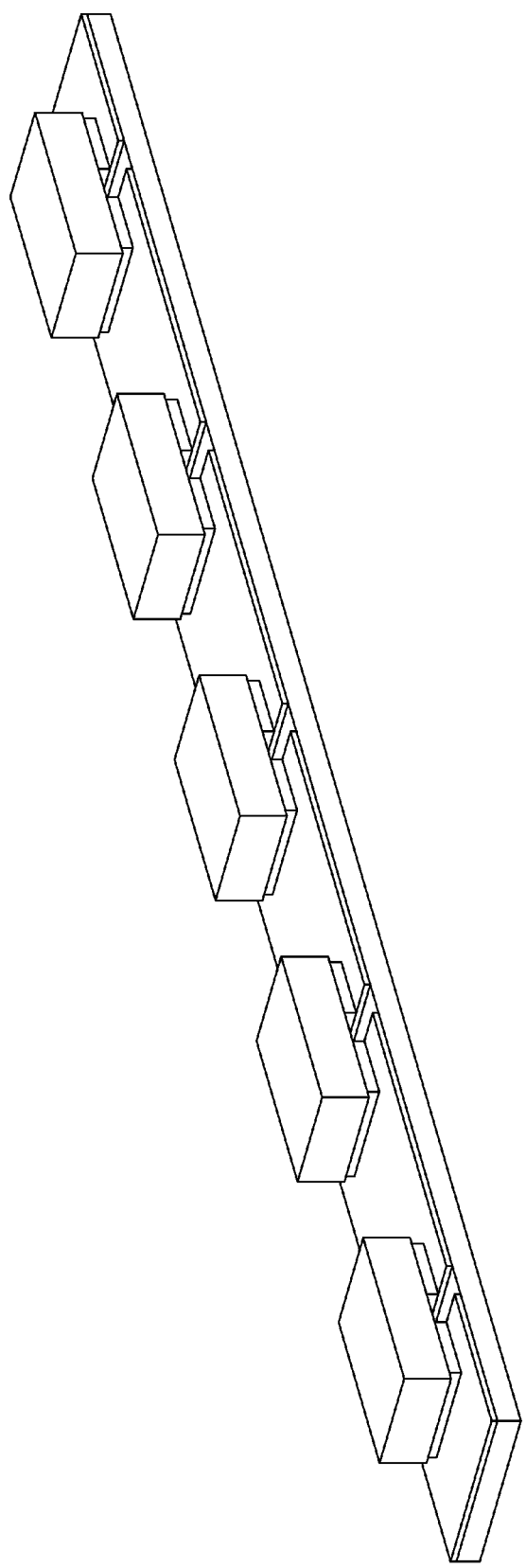

FIGS. 27-28 are exemplary schematic diagrams illustrating a backlight bar provided with the LED die packages according to the fourth preferred embodiment of the invention.

Figure 17:
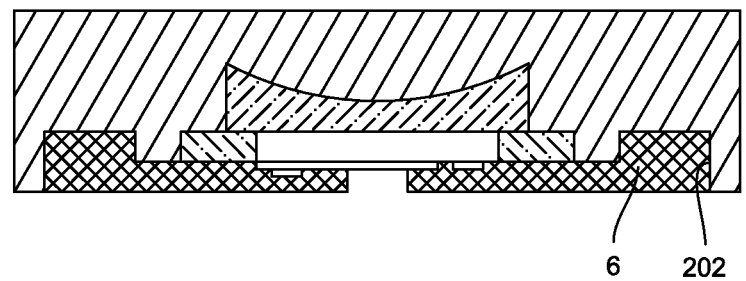
Figure 18:
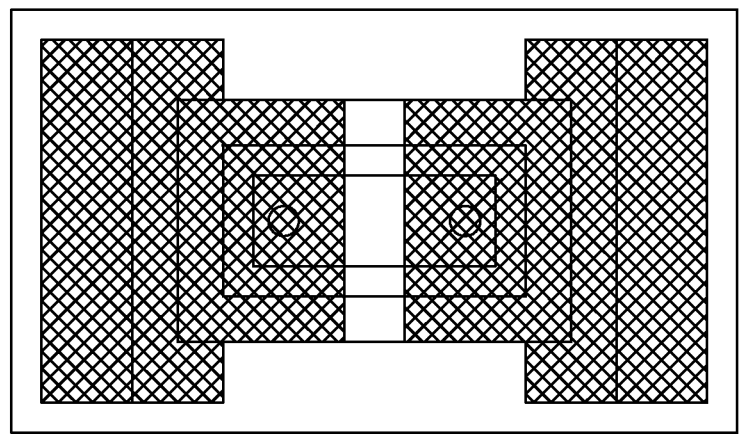
Figure 19:
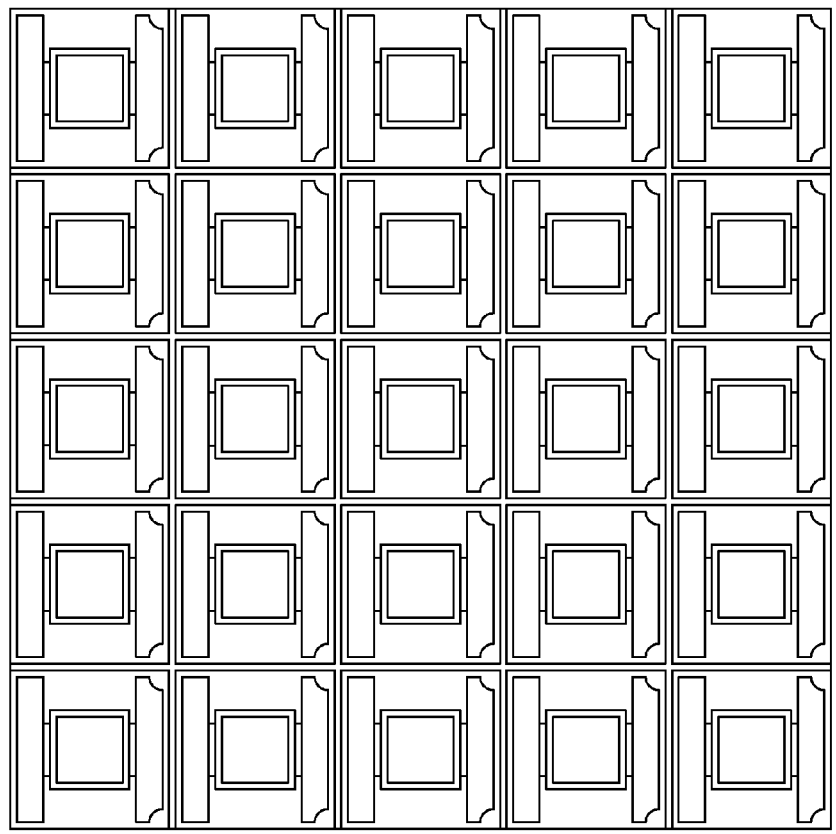
FIGS. 19-22 are schematic diagrams illustrating a method for producing an LED die package according to the fifth preferred embodiment of the invention.
Figure 20:
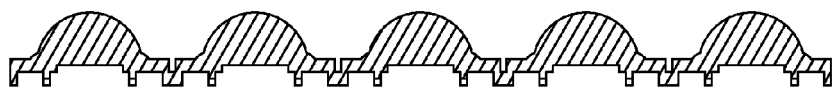

As illustrated, a number of the LED die packages shown in FIG. 17 are operatively mounted on the substrate of the backlight bar.

Figure 29:
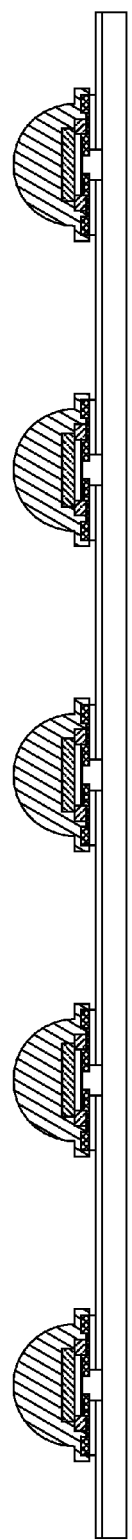
FIGS. 29 and 30 are exemplary schematic diagrams illustrating a backlight bar provided with the LED die packages according to the fifth preferred embodiment of the invention.
Figure 30:
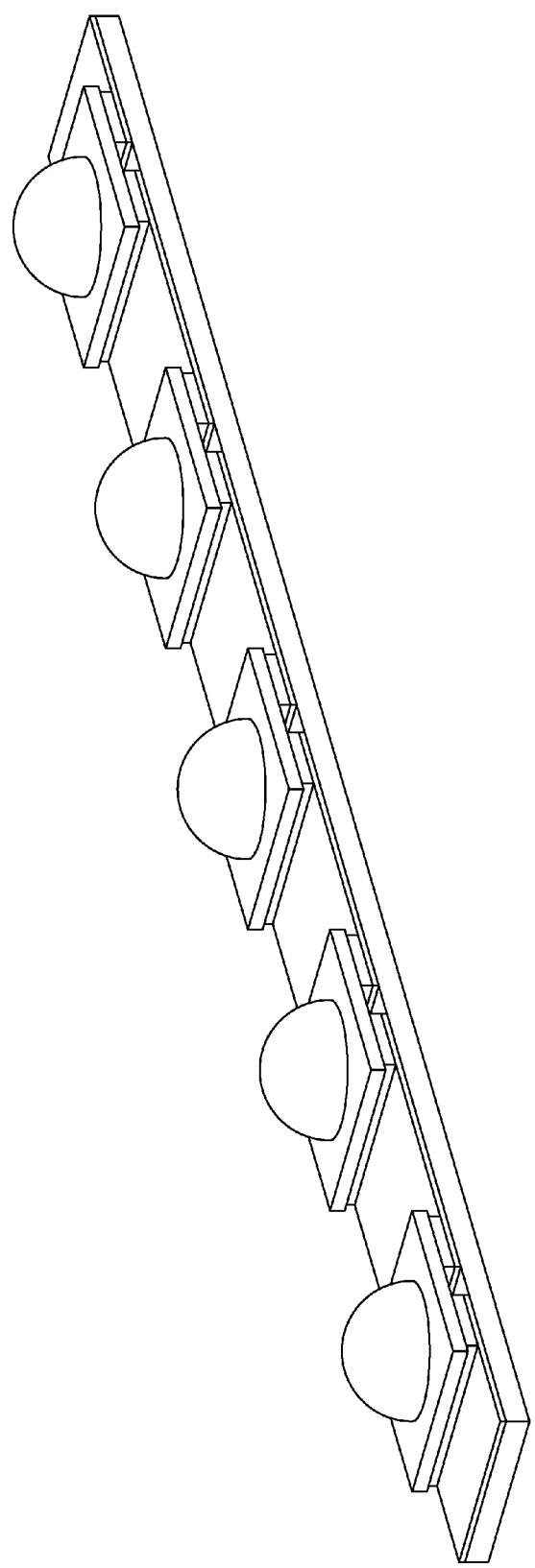
Figure 31:
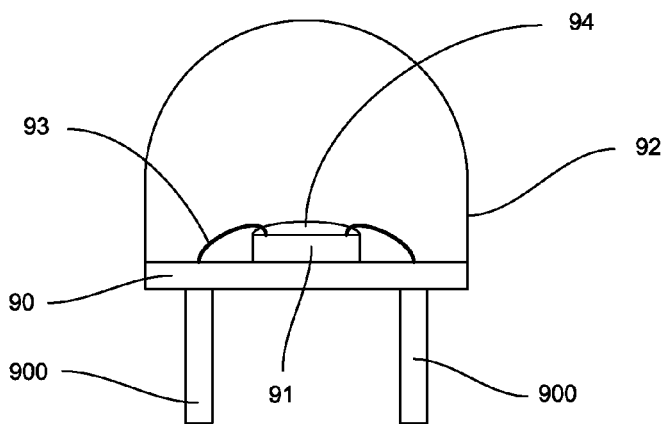
FIG. 31 is a schematic side view of a conventional LED package.
Figure 32:
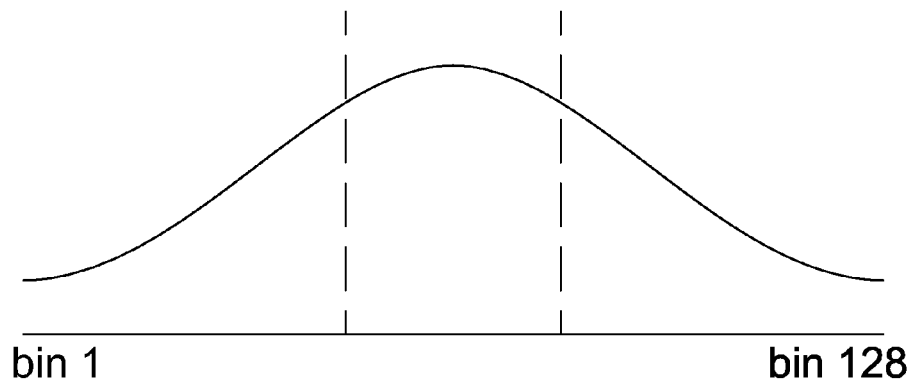
FIG. 32 is a schematic diagram showing a bin distribution of LED chips after packaging, in which the light emitted from the LED chips have the same wavelength and the same brightness.

FIGS. 29-30 are exemplary schematic diagrams illustrating a backlight bar provided with the LED die packages according to the fifth preferred embodiment of the invention.

Figure 21:
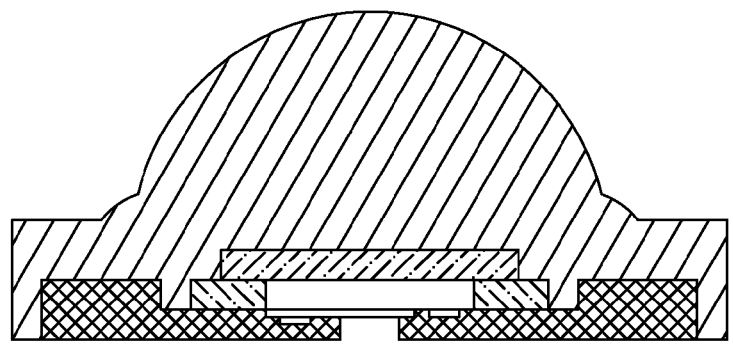
Figure 22:
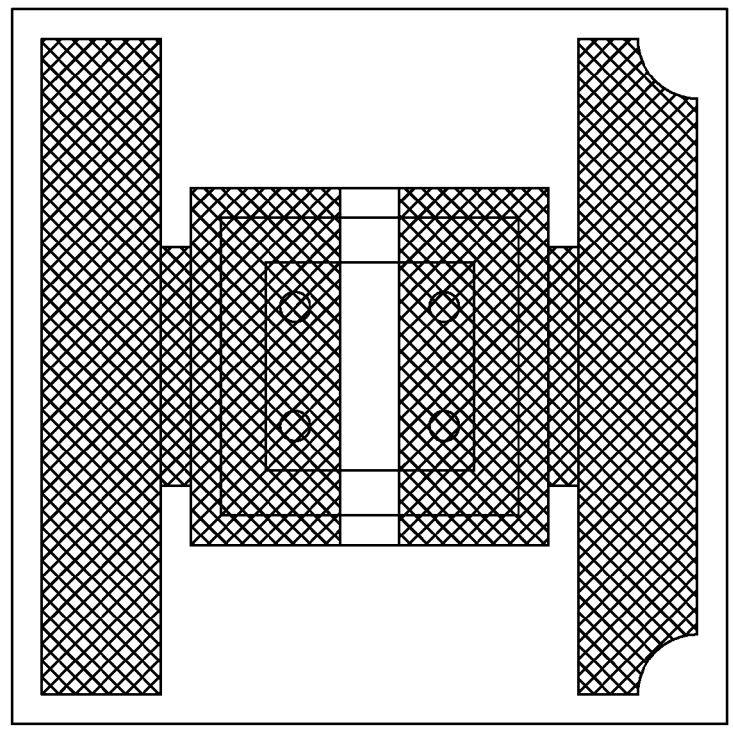

As illustrated, a number of the LED die packages shown in FIG. 21 are operatively mounted on the substrate of the backlight bar.

What is claimed is:

1. A light-emitting diode die package, comprising:
   a light-emitting diode (LED) chip having a p-type electrode and an n-type electrode;
   an accommodating housing for accommodating the LED chip, the accommodating housing being made of transparent material and defining an accommodating space, an open end through which the accommodating space is accessible, a closed end opposite to the open end, and two through holes formed on a surface of the closed end, wherein the LED chip is mounted within the accommodating space of the accommodating housing, so that the p-type electrode and the n-type electrode of the LED chip are exposed via the trough holes defined by the accommodating housing; and
   a carrier having a conductor mounting surface and predetermined conductors formed on the conductor mounting surface, wherein the LED chip disposed within the accommodating space of the accommodating housing is mounted on the conductor mounting surface of the carrier, so that the respective electrodes thereof are electrically connected to predetermined conductors formed on the conductor mounting surface of the carrier via wires.

2. The light-emitting diode die package according to claim 1, wherein the transparent material used to fabricate the accommodating housing is doped with phosphor powder.

3. The light-emitting diode die package according to claim 1, wherein the LED chip is fixed within the accommodating space of the accommodating housing by transparent adhesive material.

4. A light-emitting diode die package, comprising:
   a light-emitting diode (LED) chip having a p-type electrode and an n-type electrode, wherein one of the electrodes is disposed at bottom side of the LED chip and the other is disposed at top side of the LED chip;
   an accommodating housing for accommodating the LED chip, the accommodating housing being made of transparent material and defining an accommodating space, an open end through which the accommodating space is accessible, a closed end opposite to the open end, and a through hole formed on a surface of the closed end, wherein the LED chip is mounted within the accommodating space of the accommodating housing, so that one of the p-type electrode and the n-type electrode of the LED chip is exposed via the trough hole defined by the accommodating housing and the other of the p-type electrode and the n-type electrode of the LED chip is exposed via the open end of the accommodating housing; and
   a carrier having a conductor mounting surface and predetermined conductors formed on the conductor mounting surface, wherein the LED chip disposed within the accommodating space of the accommodating housing is mounted on the conductor mounting surface of the carrier, so that the electrode of the LED chip exposed via the open end of the accommodating housing is electrically connected to a predetermined conductor formed on the conductor mounting surface of the carrier, and the electrode of the LED chip exposed via the through hole defined by the accommodating housing is electrically connected to another predetermined conductor formed on the conductor mounting surface of the carrier via a wire.

5. The light-emitting diode die package according to claim 4, wherein the transparent material used to fabricate the accommodating housing is doped with phosphor powder.

6. The light-emitting diode die package according to claim 4, wherein the LED chip is fixed within the accommodating space of the accommodating housing by transparent adhesive material.

7. A light-emitting diode die package, comprising:
   a light-emitting diode (LED) chip having a p-type electrode and an n-type electrode;
   an accommodating housing made of transparent material and defining an accommodating space, an open end through which the accommodating space is accessible, and two conductor forming grooves formed on a surface that defines the open end;
   a transparent material layer filled within the accommodating space of the accommodating housing, wherein the LED chip is fixed on the transparent material layer in the accommodating space, with the electrodes thereof facing away from the transparent material layer, so that the respective electrodes of the LED chip are disposed in vicinity of the conductor forming grooves corresponding thereto; and
   conductors formed within the conductor forming grooves, each extending to a corresponding one of the electrodes of the LED chip in manner electrically connected to the corresponding one of the electrodes.

8. The light-emitting diode die package according to claim 7, wherein the transparent material used to fabricate the accommodating housing is doped with phosphor powder.

9. The light-emitting diode die package according to claim 7, wherein the LED chip is fixed on the transparent material layer filled within the accommodating space by transparent adhesive material.

10. The light-emitting diode die package according to claim 7, wherein the accommodating space of the accommodating housing is fabricated to generally have a bullet-head configuration.

11. The light-emitting diode die package according to claim 7, wherein the accommodating space of the accommodating housing is fabricated in a generally rectangular configuration with a bottom surface facing the open end being convex towards the open end.

12. The light-emitting diode die package according to claim 7, wherein the accommodating space of the accommodating housing is fabricated in a generally rectangular configuration.

13. The light-emitting diode die package according to claim 7, further comprising a second LED chip that is structurally identical to and serially connected to the LED chip.

14. A method for producing a light-emitting diode die package, comprising the steps of:
   fabricating a frame having an array of accommodating housings arranged in the form of a matrix, the frame being made of transparent material, wherein each of the accommodating housings includes an open end through which a generally rectangular-shaped accommodating space is accessible and is formed with at least one through hole on a surface facing the open end;
   mounting light-emitting diode (LED) chips, each provided with at least one electrode, within the accommodating spaces, so that the respective electrodes of the LED chips are registered with the through holes of the accommodating spaces corresponding thereto;
   subjecting the frame to a dicing process, so that the accommodating housings are separated from one another, and mounting each of the LED chips disposed within the accommodating spaces on a carrier the conductor mounting surface of the carrier having a conductor mounting surface and predetermined conductors formed on the conductor mounting surface; and
   electrically connecting the electrodes of the LED chips to the corresponding conductors of the corresponding carriers.

15. The method according to claim 14, wherein the transparent material used to fabricate the frame is doped with phosphor powder.

16. A method for producing a light-emitting diode die package, comprising the steps of:
   fabricating a frame having an array of accommodating housings arranged in the form of a matrix, the frame being made of transparent material, wherein each of the accommodating housings includes an open end through which an accommodating space is accessible, and two conductor forming grooves formed on a surface that defines the open end;
   filling a transparent material within the respective accommodating spaces to form a transparent material layer;
   providing a plurality of LED chips, each having two electrodes, and fixing each of the LED chips on the transparent material layer in the accommodating space, with the electrodes thereof facing away from the transparent material layer, so that the respective electrodes of the LED chip are disposed in vicinity of the conductor forming grooves corresponding thereto;
   forming conductors within the conductor forming grooves, each extending to a corresponding one of the electrodes of the LED chips; and
   subjecting the frame to a dicing process, so that the accommodating housings are separated from one another.

17. The method according to claim 16, wherein the transparent material used to fabricate the frame is doped with phosphor powder.

18. The method according to claim 16, wherein each of the accommodating spaces is fabricated to generally have a bullet-head configuration.

19. The method according to claim 16, wherein each of the accommodating spaces is fabricated in a generally rectangular configuration.

20. The method according to claim 16, wherein each of the accommodating spaces is fabricated in a generally rectangular configuration with a bottom surface facing the open end being convex towards the open end.

21. A backlight bar comprising a substrate having a circuit mounting surface, on which predetermined circuit traces are formed, the backlight bar further comprising:
   a plurality of the LED die packages according to claim 7, each being mounted on the substrate by electrically connecting the conductors to the corresponding circuit traces formed on the substrate.

* * * * *